United States Patent [19]
Kawamoto

[11] Patent Number: 4,695,864
[45] Date of Patent: * Sep. 22, 1987

[54] DYNAMIC STORAGE DEVICE WITH EXTENDED INFORMATION HOLDING TIME

[75] Inventor: Hiroshi Kawamoto, Kodaira, Japan

[73] Assignee: Hitachi, Ltd., Tokyo, Japan

[*] Notice: The portion of the term of this patent subsequent to Jan. 1, 2002 has been disclaimed.

[21] Appl. No.: 488,644

[22] Filed: Apr. 26, 1983

Related U.S. Application Data

[60] Division of Ser. No. 154,826, May 30, 1980, which is a continuation of Ser. No. 851,692, Nov. 15, 1977, abandoned.

[30] Foreign Application Priority Data

Nov. 19, 1976 [JP] Japan ................................. 51-138341

[51] Int. Cl.⁴ ..................... H01L 27/02; H01L 29/78; H01L 29/04; G11C 11/24
[52] U.S. Cl. ................................... 357/41; 357/23.6; 357/23.11; 357/59; 365/149
[58] Field of Search .................... 357/23.6, 41, 23.11; 365/149

[56] References Cited

U.S. PATENT DOCUMENTS

| | | | |
|---|---|---|---|
| 3,573,509 | 4/1971 | Crawford | 357/41 |
| 3,748,187 | 7/1973 | Aubuchon | 357/41 |
| 3,771,147 | 11/1973 | Boll et al. | 357/41 |
| 3,798,512 | 3/1974 | Critchlow et al. | 357/41 |
| 3,879,640 | 4/1975 | Shade | 317/31 |
| 3,896,485 | 7/1975 | Early | 357/24 |
| 4,044,340 | 8/1977 | Itoh | 365/149 |
| 4,044,373 | 8/1977 | Nomiya et al. | 357/41 |
| 4,086,662 | 4/1978 | Itoh | 357/41 |
| 4,110,776 | 8/1978 | Rao et al. | 357/59 |
| 4,112,508 | 9/1978 | Itoh | 365/154 |
| 4,118,794 | 10/1978 | Mizuno et al. | 357/41 |
| 4,163,245 | 7/1979 | Kinoshita | 357/23.6 |
| 4,491,858 | 1/1985 | Kawamoto | 357/41 |

OTHER PUBLICATIONS

Critchlow et al, "Design and Characteristics of N—Channel Insulated-Gate Field-Effect Transistors", IBM J. Research and Development (9/73), pp. 430–441.

Primary Examiner—Gene M. Munson
Attorney, Agent, or Firm—Antonelli, Terry & Wands

[57] ABSTRACT

A memory cell of a dynamic storage device is composed of a MOSFET and a capacitor. On a single semiconductor substrate, a plurality of such memory cells are regularly arranged in a plurality of columns and constitute a memory cell array or memory cell mat. The capacitor for the memory cell is made up of a semiconductor region of the type which possesses a conductivity opposite to that of the semiconductor substrate, and a conductor film which is formed on the semiconductor region through a comparatively thin oxide film. On that surface of the semiconductor substrate which is not formed with the MOSFET's and the capacitors, a comparatively thick oxide film is formed. In that surface of the semiconductor substrate which extends along the vicinity of an end portion of the memory cell mat, there is arranged a semiconductor region of the type which possesses a conductivity opposite to, or the same as, that of the semiconductor substrate and which serves to prevent minority carriers created in the semiconductor substrate from flowing into the substantially opposite conductivity type semiconductor regions of the capacitors of the memory cells. The distance between this semiconductor region and the capacitor at the end part of the memory cell mat is made approximately equal to, or shorter than, the distance between the capacitors in the memory cell mat. Owing to this semiconductor region, the information holding time of the memory cells at the end portion of the memory cell mat becomes sufficiently long.

17 Claims, 13 Drawing Figures

DYNAMIC STORAGE DEVICE WITH EXTENDED INFORMATION HOLDING TIME

This is a division of application Ser. No. 154,826, filed May 30, 1980, which is a continuation of application Ser. No. 851,692, filed Nov. 15, 1977, now abandoned.

BACKGROUND OF THE INVENTION

This invention relates to a semiconductor memory, and more particularly to a dynamic storage device which makes use of a capacitor as means for accumulating information.

A memory employing metal-insulator-semiconductor field effect transistors (MISFET's) represented by the so-called MOS (metal-oxide-semiconductor) FET's can easily exploit the dynamic storage action of a capacitor or a stray capacitance, and is therefore used in large numbers from the viewpoints of raising the density of integration, lowering the price, etc. Among the MOS memories, one which has recently been highlighted most is the so-called 1 Trs/cell memory (termed "1-element memory" hereafter) employing one MOSFET and capacitor per bit as, for example, published in 'ISSCC Digest of Technical papers,' pp. 140-141, Feb 1976 by K. Itoh et al. Stored information in the 1-element memory is read out to a data line by bringing the MOSFET of the memory into the "on" state. In accordance with this read-out, the potential of the data line changes in such a manner that charges having been accumulated in the capacitor of the 1-element memory are allotted to the capacitors associated with the data line. Accordingly, the potential of the data line corresponds to the information stored in the 1-element memory. By impressing the potential of the data line on a "read" circuit, the stored information from the 1-element memory is read out. The 1-element memory is disadvantageous in that the "read" level of the stored information is low since the level of the data line is determined by the allotment of the charges. However, the capacitance of the capacitor can be made small by endowing the "read" circuit with a high sensitivity. The 1-element memory is advantageous in that the occupying area per bit in a semiconductor substrate can be made small as a semiconductor integrated circuit since the number of the constituent elements per bit is small.

In memories, such as the 1-element memory, of the type wherein charges accumulated in a capacitor and an information are caused to correspond, the charges accumulated in the capacitor leak through various paths. Therefore, the "read" level which appears on the data line in reading out the stored information varies depending on the period of time of the information holding operation of the memory cell. In the memories of the type as described above, the "read" level which lowers or changes due to the leakage of the charges from the capacitor must not exceed the allowable input level of the "read" circuit, so that only a limited information holding time is exhibited. The memories of this type accordingly hold information only temporarily and are called "dynamic memories."

In the form of a semiconductor integrated circuit, a plurality of memory cells each being built up of the 1-element memory as described above are regularly arrayed in a plurality of columns on a semiconductor substrate and constitute a memory cell array or memory cell mat.

When studying the improvement in the "read" level of the 1-element memory, the inventors discovered that the information holding time of memory cells arranged at an end portion of the memory cell array is shorter by a ratio of ½-1/10 as compared with that of memory cells at an inner portion. When the information holding time is short, the cycle for rewriting or refreshing the stored information must be raised, and a serious limitation upon use is imposed onthe whole memory system.

SUMMARY

A capacitor for a memory cell is made up of a semiconductor region in the surface of a semiconductor substrate, and a conductive layer which is formed on the semiconductor region through a thin oxide film serving as a dielectric. The semiconductor region is one of a conductivity type substantially opposite to that of the semiconductor substrate, for example, an inversion region which is induced in the surface of the semiconductor substrate by an electric field established by the conductive layer, or a diffused region which is formed by diffusing an impurity which determines conductivity type. On that surface of the semiconductor substrate in which neither MISFET's nor the capacitors are formed, a comparatively thick oxide film is formed.

In this invention, a semiconductor region of a conductivity type substantially opposite to that of the semiconductor substrate or a semiconductor region of the type which possesses the same conductivity as that of the semiconductor substrate and a high impurity concentration is arranged in that surface of the semiconductor substrate which extends along the vicinity of an end portion of a memory cell mat or memory cell array.

It has been revealed that, by the arrangement of such a semiconductor region along the vicinity of the end portion of the memory cell mat, the information holding time of the memory cells along the end portion of the memory cell mat becomes sufficiently long.

Accordingly, the principal object of this invention is to lengthen the information holding time of a dynamic storage device which exploits the action of a capacitor or a stray capacitance for temporarily holding information.

Another object of this invention is to provide a dynamic storage device which can lengthen the information holding time with a simple construction.

This invention and further objects thereof will become more apparent from the following description taken with reference to the drawings.

REFERENCE TO DRAWINGS

DETAILED DESCRIPTION

Figure 1:
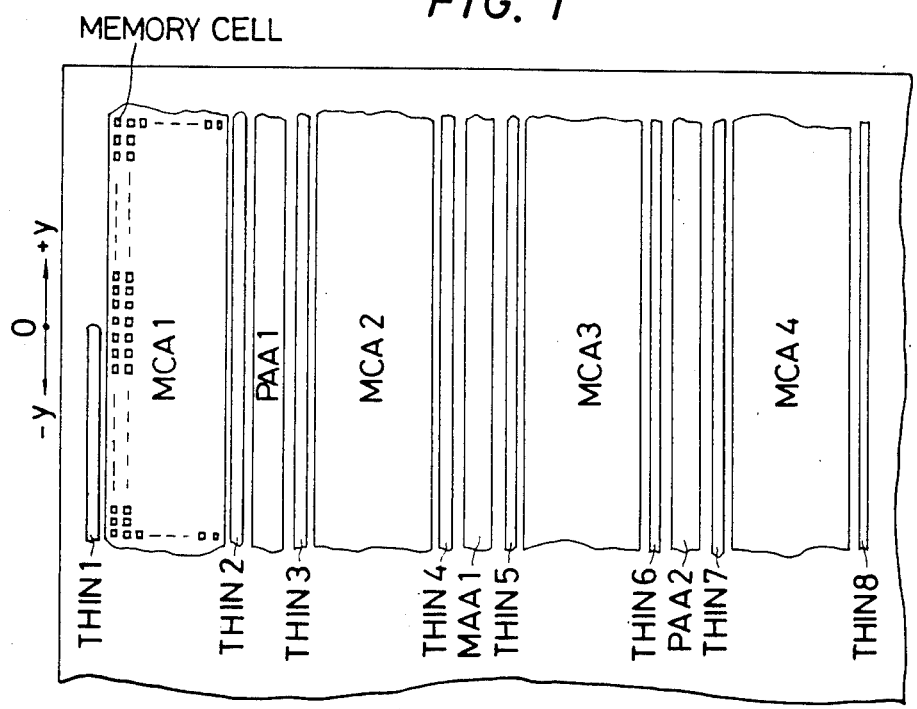
FIG. 1 is a plan view for schematically explaining the arrangement of a dynamic storage device according to this invention.

As primary factors in the leakage of charges in a 1-element memory cell, there are considered leakage through a path between the source and drain of a switching MISFET ascribable to the fact that the switching MISFET which ought to be in the "off" state during the information holding period does not perfectly attain an "off" state, leakage through a parasitic circuit element as takes place due to the activation of the parasitic circuit element, and leakage in a capacitor itself. With these factors taken into account, the inventors analyzed the phenomenon in which there is a decrease in the information holding time of memory cells at an end portion of a memory cell mat as described previously. As a result, it has been ascertained that the serious cause will possibly lie in the capacitor itself rather than in the undesirable operation of the switching MISFET and the activation of the parasitic circuit element.

The information holding time of the memory cells is the shortest in the memory cells in one column situated at the end portion of the memory cell mat, and is long in the memory cells at the inner or central portion of the memory cell mat, i.e., in the other columns including a column adjacent to the end column. Moreover, the information holding times of the memory cells at the central portion including the adjacent column are approximately equal.

On a semiconductor substrate, as to a memory cell column at the central portion of the memory cell mat, another memory cell column is arrayed immediately adjacent thereto and at a comparatively small spacing therefrom. In contrast, at the end portion of the memory cell mat, another memory cell column cannot, of course, be arranged on one side immediately adjacent thereto. In addition, a group of other circuits is often arranged at a considerable distance from the end portion of the memory cell mat.

In this manner, the relation between the continuity of arrangement of the memory cells at the central portion of the memory cell mat and the discontinuity of arrangement of the memory cells at the end portion of the memory cell mat corresponds to the difference in information holding times. Therefore, the causes by which the information holding time of the memory cells at the end part of the memory cell mat is shortened have been considered in relation to the surface effects of a semiconductor as stated below though they have not yet been definitely confirmed.

One of the causes considered is crystal defects which appear due to thermal stress acting on the surface of the semiconductor substrate, as well as minority carriers which are created by the crystal defects.

At the inner or central portion of the memory cell mat, a thick oxide film which intervenes between a thin oxide film for the capacitor of a memory cell and a thin oxide film for the capacitor of another memory cell is comparatively narrow. On the other hand, at the end portion of the memory cell mat, no memory cell column is arranged on at least one side of the surroundings of a thin oxide film for the capacitor of a memory cell, and hence, the thick oxide film is comparatively wide.

In this case, the semiconductor substrate and the oxide film overlying the surface thereof have different coefficients of thermal expansion, so that thermal stress acts on the semiconductor substrate surface. The thermal stress becomes greater the thicker and wider the oxide film, and it will become large at the boundary portion between the thin oxide film and the thick oxide film. Especially, the stress will become still greater in a case where the thick oxide film is formed by thermally oxidizing the surface of the semiconductor substrate. In the presence of this thermal stress, crystal defects of transition etc. appear in the surface of the semiconductor substrate. The crystal defects will trap heavy metals such as gold, silver, copper and lead. Since, as described above, the broad and thick oxide film is arranged on the semiconductor surface adjoining the end portion of the memory cell mat, the crystal defects will be generated more in the vicinity of this portion.

Such crystal defects create more minority carriers. In consequence, the minority carriers which develop and diffuse in the semiconductor surface adjoining the end portion of the memory cell mat flow into the semiconductor region constituting the capacitor of the memory cell at the mat end portion. Such a minority carrier flow is the leakage current of the capacitor.

Another cause considered is a depletion layer in the surface of the semiconductor substrate, as well as minority carriers created in the semiconductor substrate.

A depletion layers spreads in the semiconductor substrate around a semiconductor region of a conductivity type opposite to that of the semiconductor substrate or an inversion region induced by an electric field, such a region constructing one electrode region of the capacitor.

Together with such a depletion layer, a depletion layer spreads in the semiconductor substrate surface which forms an interface with the oxide film. This depletion layer is attributed to the formation of the oxide film and an electric field established by various conductor layers or ions on the oxide film.

The depletion layer around the one electrode region of the capacitor and the depletion layer in the semiconductor substrate surface are continuous in the semiconductor substrate surface. As a result, an electric field extending towards the one electrode region of the capacitor is generated in the depletion layer in the semiconductor substrate surface.

Minority carriers excited by heat, radioactive rays, etc. exist in the semiconductor substrate, and they diffuse into the semiconductor substrate. The minority carriers having arrived at the depletion layer in the semiconductor substrate surface are collected at the one electrode region of the capacitor by the electric field within this depletion layer. As the result, a leakage current to the capacitor arises.

At the inner or central portion of the memory cell mat, the memory cells are successively arranged, and the spacings among the memory cells are small. In consequence, the semiconductor substrate surface surrounding the individual memory cell has a comparatively small area which is determined by the pitch of the memory cells.

In contrast, regarding the end portion of the memory cell mat, the semiconductor surface of comparatively large area extends outside the end portion.

Therefore, the area of the depletion layer in the semiconductor substrate surface continuous to the one electrode region of the capacitor of the memory cell differs at the central part and at the end part of the memory cell mat.

Since the semiconductor substrate surface extending around the end part of the memory cell mat is of large area, the leakage current to the capacitor at the end part becomes high.

Many points have not yet been clarified as to the surface phenomena of semiconductors, and the causes for the foregoing problem cannot be clearly confirmed. The decrease in the information holding time at the end portion of the memory cell mat, however, has been considered in relation to the behavior of the minority carriers at the mat end portion as described above.

On the basis of the idea of limiting current attributed to the minority carriers which flow into the capacitor of the memory cell at the end portion of the memory cell mat, the inventors have arranged semiconductor regions THIN 1 - THIN 8 of opposite conductivity to that of a semiconductor substrate along the vicinities of end portions of memory cell arrays or memory cell mats MCA 1–MCA 4 as illustrated by oblique lines in FIG. 1.

In FIG. 1, each of the memory cell mats MCA 1–MCA 4 is constructed of a purality of memory cells. A pre-amplifier PAA 1 for the memory cell mats MCA 1 and MCA 2 is arranged between these memory cell mats. Likewise, a pre-amplifier PAA 2 is arranged for the memory cell mats MCA 3 and MCA 4. Further, a main amplifier MAA 1 for the pre-amplifiers PAA 1 and PAA 2 is arranged between the memory cell mats MCA 2 and MCA 3.

As will be described more in detail with reference to FIGS. 4 to 8 later, the semiconductor regions THIN 1 to THIN 8 are connected to a power source $V_{DD}$. Accordingly, the p-n junctions between these semiconductor regions THIN 1–THIN 8 and the semiconductor substrate are subject to a reverse bias voltage.

Figure 2:
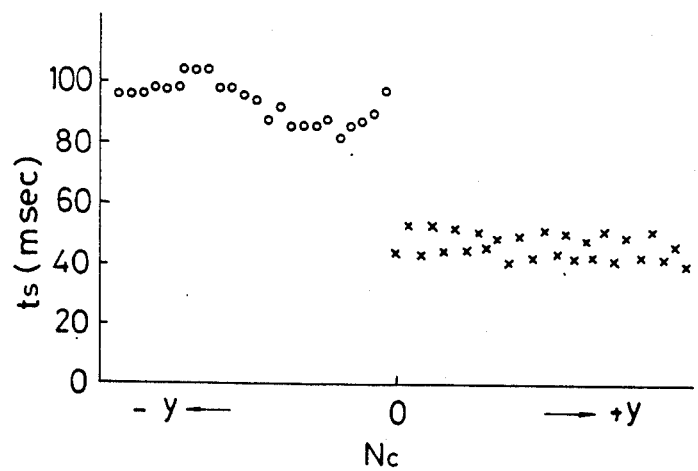
FIG. 2 is a characteristic diagram of the information holding times of memory cells for elucidating the effect of this invention.

As to the left end portion of the memory cell mat MCA 1 in FIG. 1, for the sake of comparison, the thin semiconductor region THIN 1 is arranged in the ($-y$) direction from point 0 on the drawing, whereas such a semiconductor region is not provided in the ($+y$) direction. The information holding time $t_s$ of a memory cell column at the left end portion of the memory cell mat MCA 1 was measured. Then, it was revealed that, as illustrated in FIG. 2, the information holding time $t_s$ of the memory cells at a location where no measurement was taken was 40–50 (msec), whereas the information holding time $t_s$ of the memory cells with the semiconductor region THIN 1 arranged near by was improved to 80–100 (msec) or about double.

Hereunder, such a measure of improvement will be described more concretely. Prior to the description, the outline of the 1-element memory will be explained with reference to a circuit diagram of FIG. 3.

Figure 3:
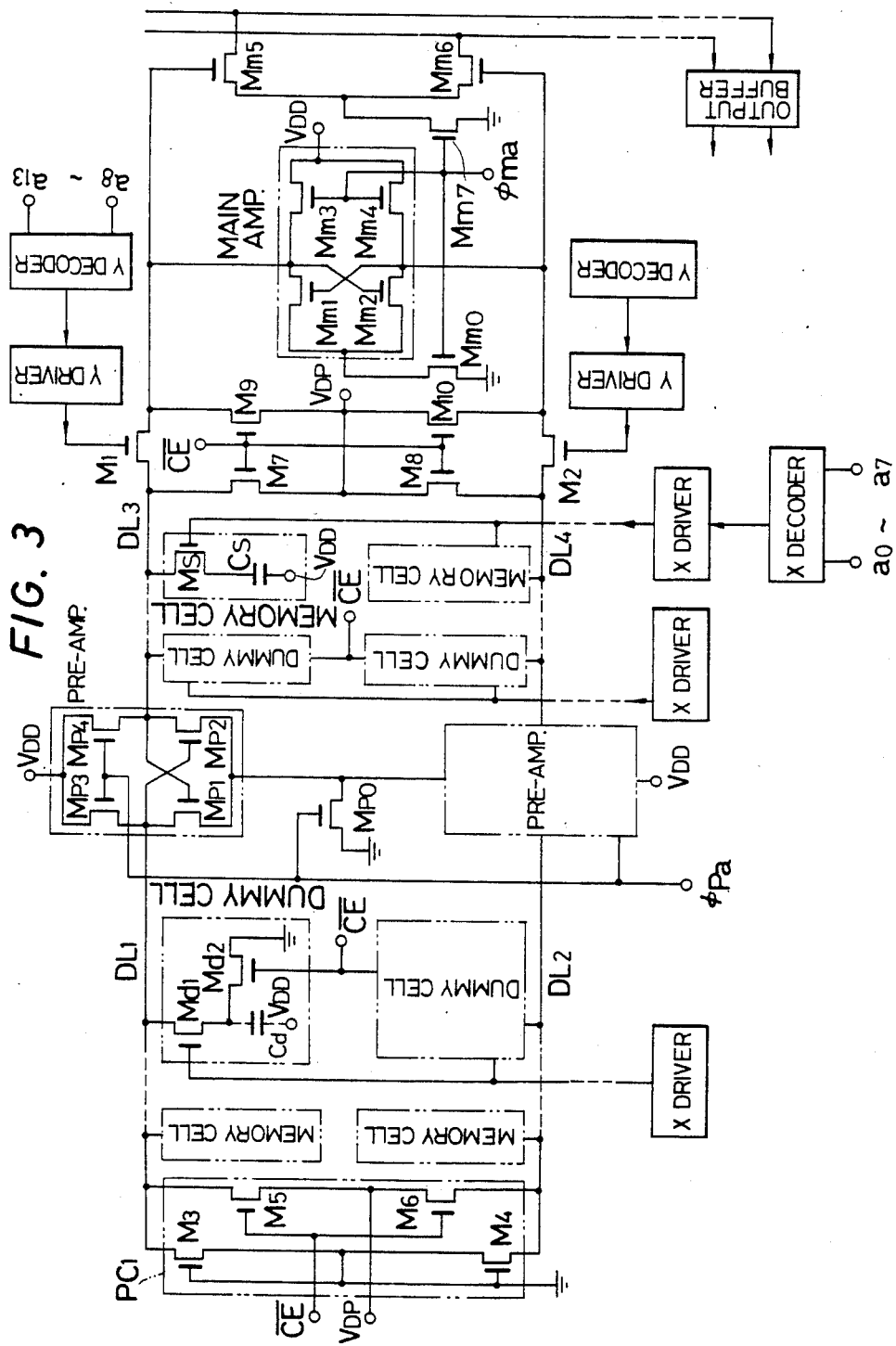
FIG. 3 is a circuit diagram for explaining a 1-element memory.

In FIG. 3, a memory cell of 1 bit is constructed of a MISFET $M_s$ and a capacitor $C_s$. The capacitor $C_s$ functions to hold information. When the information is to be written in, read out or refreshed, the MISFET $M_s$ is made conductive by the level of a word line as is an output from an X driver, and it selectively connects the capacitor $C_s$ and the data line DL.

A pre-amplifier serves to read out the information accumulated in the selected memory cell. By comparing the information with the "read" level of a dummy cell connected to a data line on the opposite side, it discriminates whether the information stored in the memory cell is logical "1" or "0".

A main amplifier is employed in order to amplify an output from the pre-amplifier and speed up the "read" of data. MISFET's $M_1$ and $M_2$ serve to select data lines $DL_3$, $DL_4$ . . . in accordance with the contents of address signals $a_8$–$a_{13}$ in the Y direction. A portion $PC_1$ is employed in order to charge the stray capacitances of the data lines $DL_1$ and $DL_2$ on the opposite sides to the respective data lines $DL_3$ and $DL_4$ prior to the selection of the cell. MISFET's $M_3$ and $M_4$ are added in correspondence with the MISFET's $M_1$ and $M_2$ inorder to endow the data lines $Dl_1$ and $Dl_2$ with capacitances substantially equal to the PN-junction capacitances of diffused regions of the MISFET's $M_1$ and $M_2$ incorporated in the data lines $DL_3$ and $DL_4$ on the opposite sides and to establish the symmetry of the capacitances of the data lines $DL_1$, $DL_2$ and the data lines $DL_3$, $DL_4$.

The operation of the circuit shown in FIG. 3 is the same as that of, for example, "A High-Speed 16K-bit N MOS RAM" published by K. Itoh et al in 'ISSCC Digest of Technical Papers,' pp. 140-141, Feb 1976.

The data lines $DL_1$ to $DL_4$, for example, are precharged to a level $V_{DP}$ through MISFET's $M_5$ to $M_8$ by a signal $\overline{CE}$ at the time when a chip is non-selected. Capacitors in the dummy cells lie in the discharge state by MISFET's $Md_2$.

When the chip is selected, the MISFET's $M_5$ to $M_8$ are rendered "off" by the signal $\overline{CE}$. When, at the chip selection, the dummy cells respectively connected to the data lines $DL_1$ and $DL_2$ are operated by the X driver and the memory cells respectively connected to the data lines $DL_3$ and $DL_4$ are operated by a word pulse from the X driver, the distribution of charges arises among capacitors (not shown) of the data lines $DL_1$ to $DL_4$ and the capacitors of the memory cells or dummy cells. In the distribution of charges, the potential of the data lines $DL_1$, $DL_2$ with the dummy cells connected thereto becomes a potential which is intermediate between potentials appearing on the data lines $DL_3$, $DL_4$ as are determined when the information stored in the memory cells is logical "0" and "1" respectively.

As the result, when the information stored in the memory cell connected to the data line $DL_3$ is logical "1", the potential of the data line $DL_3$ becomes higher than that of the data line $DL_1$. The difference between the potential levels of the data lines $DL_3$ and $DL_1$ at this time is comparatively small. However, when the preamplifier consisting of MISFET's $M_{p1}$ to $M_{p4}$ starts operating by the next clock pulse signal $\phi_{pa}$ following the timing of the X driver, the potential difference between the data lines $DL_3$ and $DL_1$ is emphasized because the pre-amplifier has a positive feedback loop.

Likewise, the potential difference between the data lines $DL_4$ and $DL_2$ is emphasized.

When the MISFET $M_1$ is rendered "on" by an output from a Y driver at the next timing, the level of the data line $DL_3$ is applied to a main amplifier. Further, when the main amplifier is operated by a clock pulse signal $\phi_{ma}$ at the next timing, the level of the data line $DL_3$ is put into an output buffer through MISFET's $Mm_5$ and $M_{m6}$. When the information from the data line $DL_4$ is to be read out, the MISFET $M_2$ is rendered "on".

Similarly, when stored information is to be read out from memory cells connected to the data lines $DL_1$, $DL_2$, dummy cells connected to the data lines $DL_3$, $DL_4$ are operated.

Figure 4:
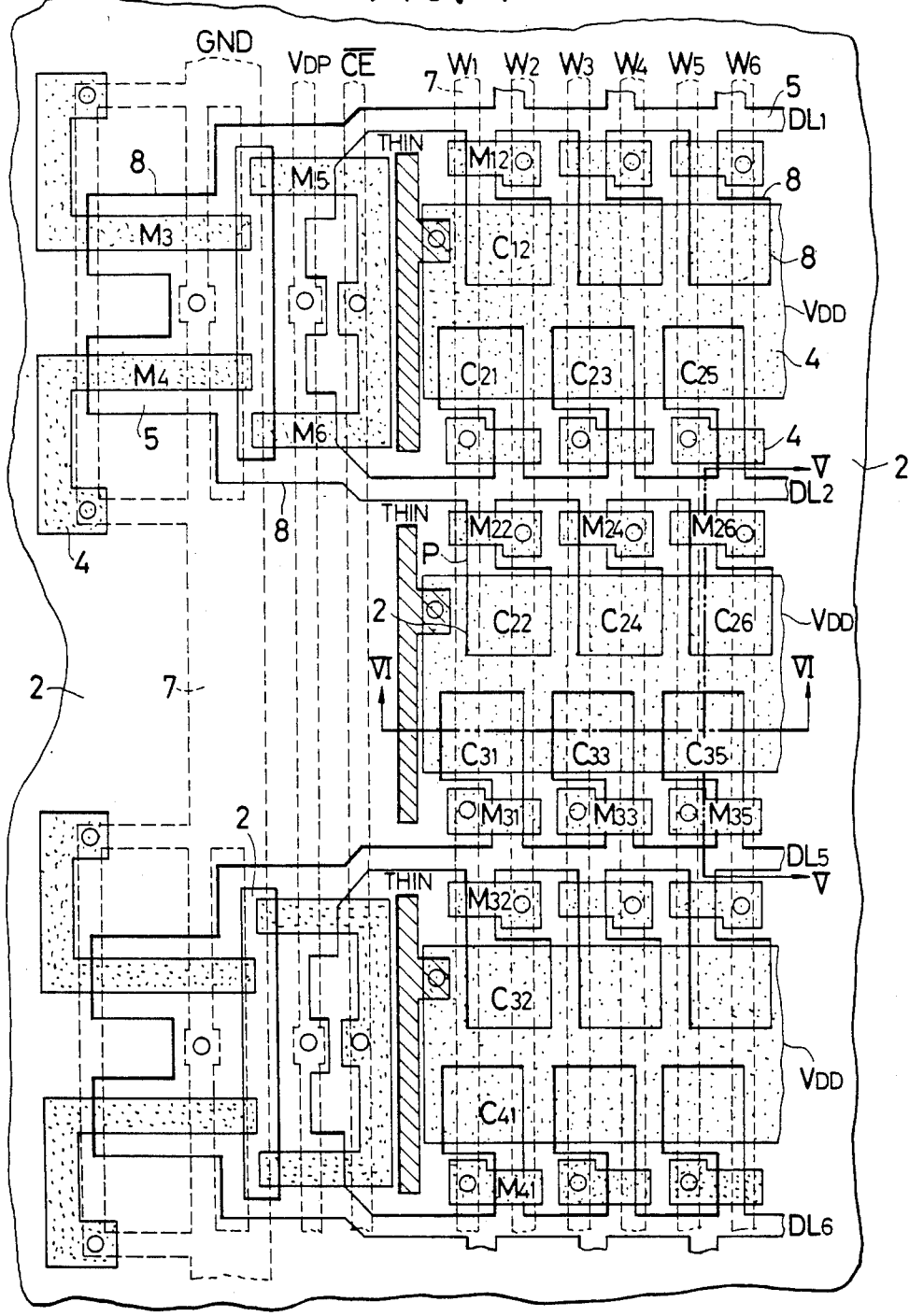
FIG. 4 is a plan view of the dynamic storage device.
Figure 5:
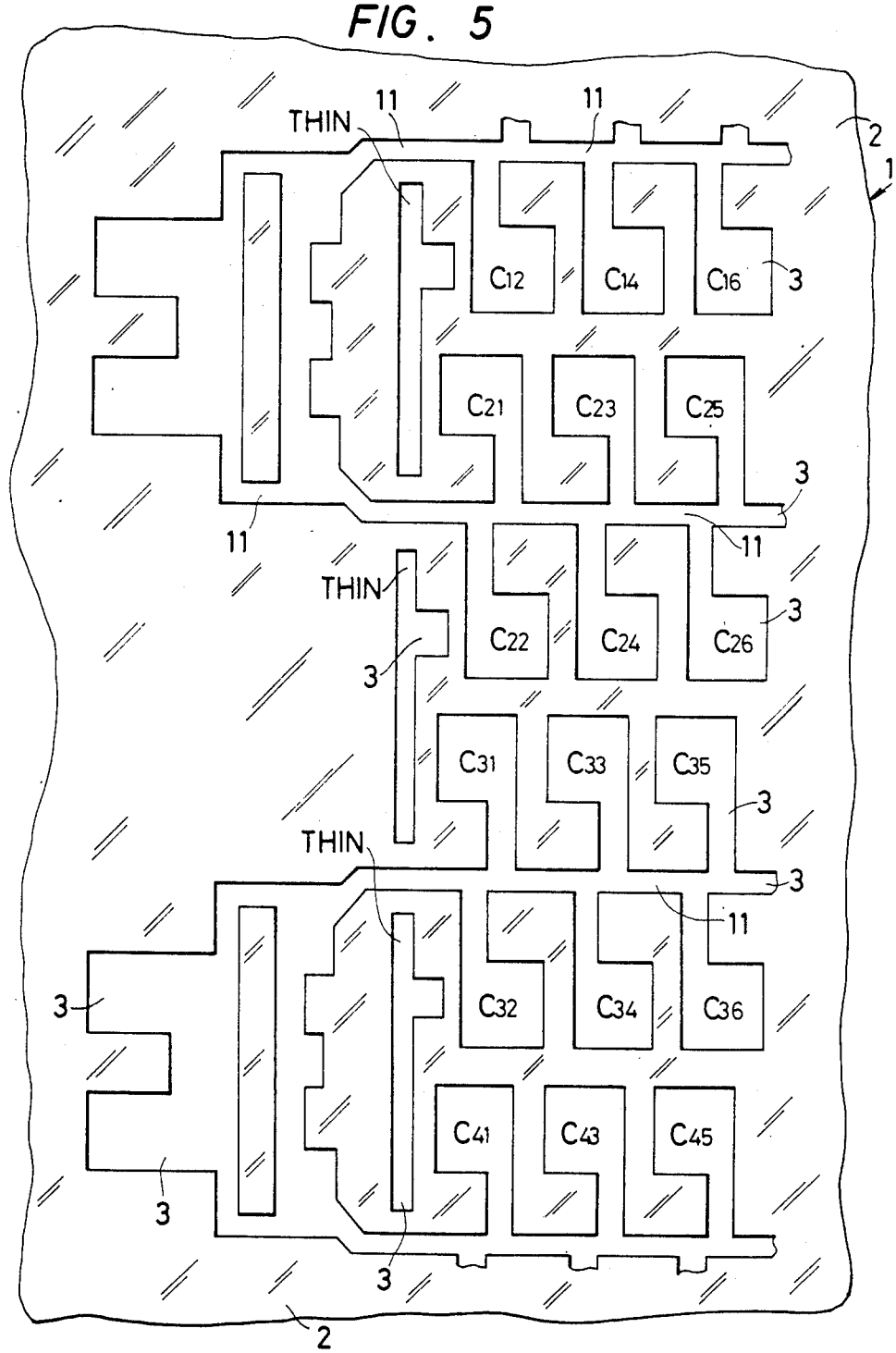
FIG. 5 is an oxide film pattern of the storage device of FIG. 4.
Figure 6:
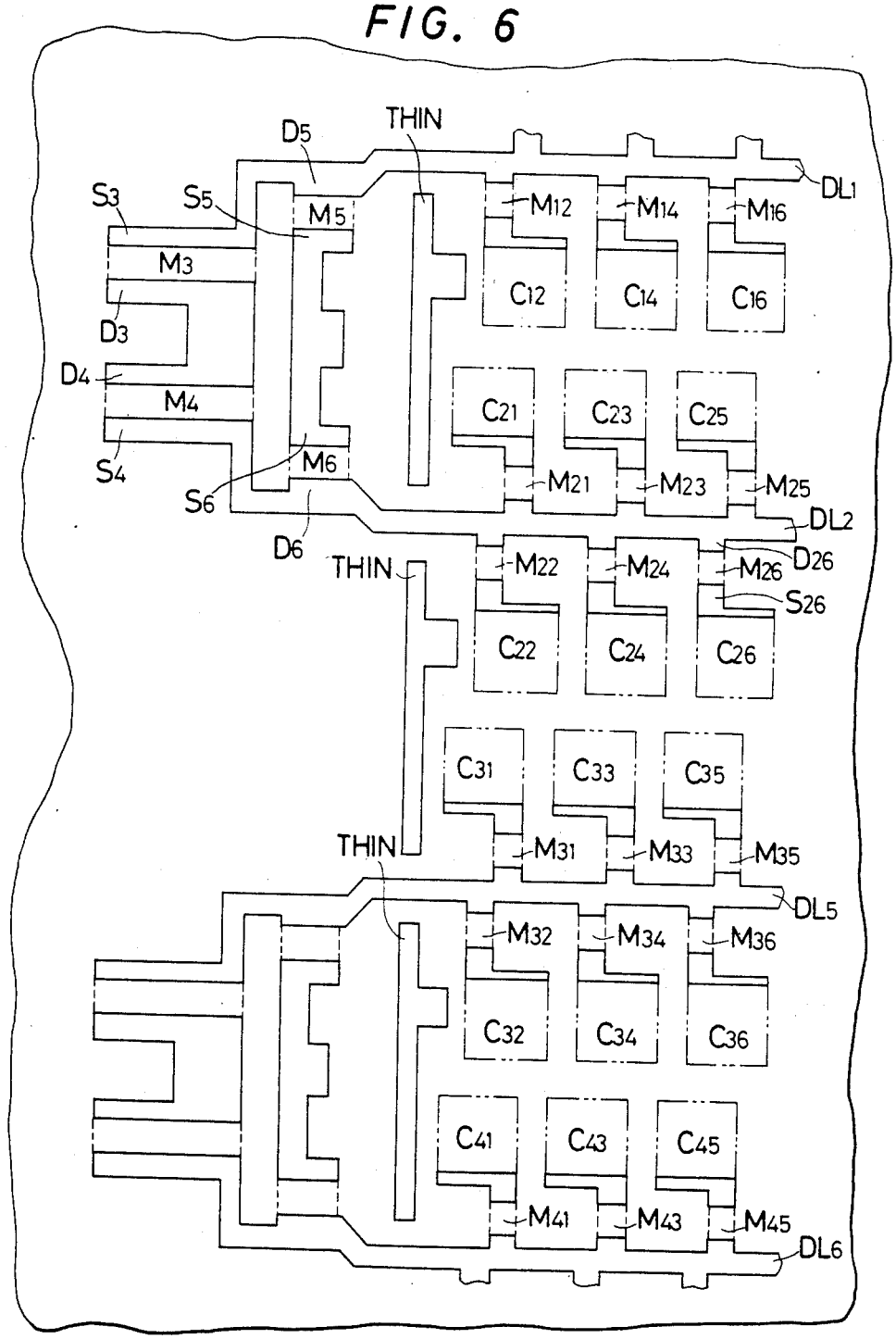
FIG. 6 is a pattern showing source, drain and gate regions of MISFET's capacitor regions and interconnection regions which constitute the storage device of FIG. 4.
Figure 7:
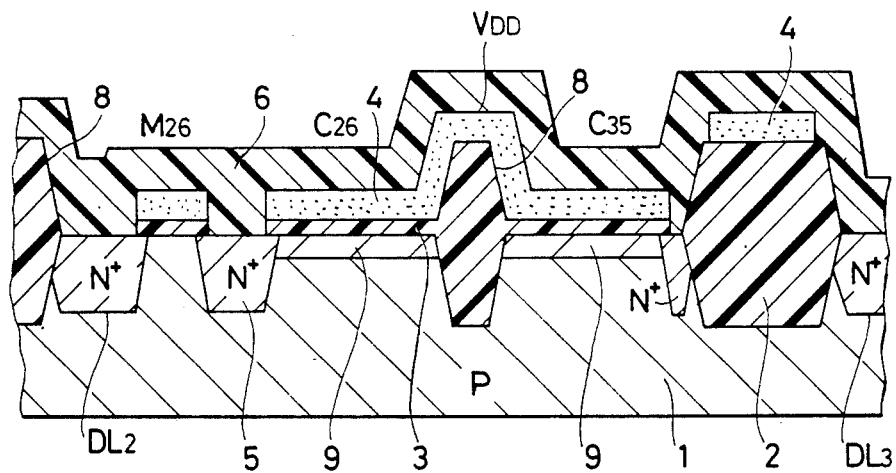
FIG. 7 is a sectional view taken along line V—V in FIG. 4.
Figure 8:
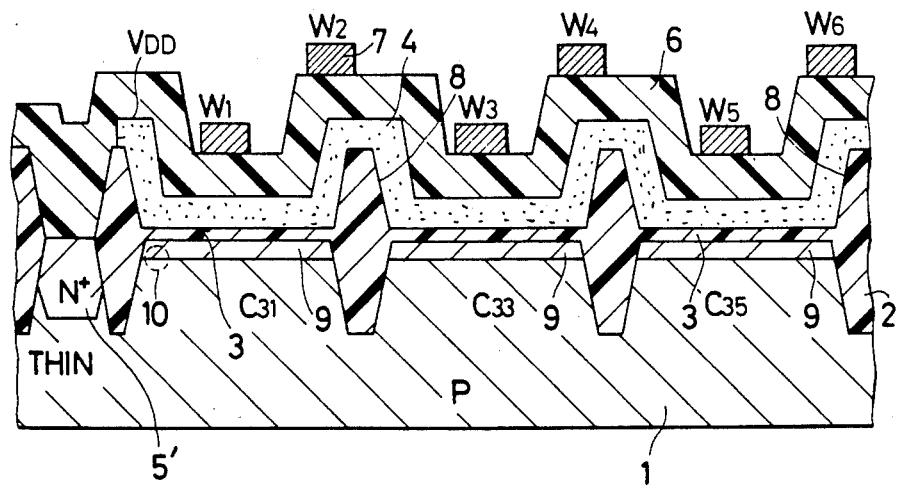
FIG. 8 is a sectional view taken along line VI—VI in FIG. 4.

Regarding the construction of memory cell columns and peripheral portions thereof, refreence will be had to the plan views of FIGS. 4 to 6, a sectional view of FIG. 7 taken along line V—V in FIG. 4, and a sectional view of FIG. 8 taken along line VI—VI in FIG. 4.

FIG. 4 shows memory cells which belong to the data lines $DL_1$, $DL_2$ on the left side of the circuit of FIG. 3 and to data lines $DL_5$, $DL_6$ not shown in FIG. 3. In FIG. 4, letter M's with numerals suffixed designate MISFET's, and letter C's with numerals suffixed designate capacitors. A MISFET and capacitor of the same numeral, for example, $M_{26}$ and $C_{26}$, constitute a memory cell of 1 bit.

Although no special restriction is intended, the MISFET's are fabricated by the silicon gate techinique. One electrode of each of the capacitors is made of polycrystaline silicon.

$W_1$ to $W_6$ indicate word lines which receive outputs from the X drivers in FIG. 3. The word lines are connected with silicon gate electrodes at portions marked ○ in the figure. As a result, MISFET's of a column connected to the word line selected at "write", "read" or "refresh" become the conductive state. By way of example, when the word line $W_2$ is selected, MISFET's $M_{12}$, $M_{22}$, $M_{32}$ . . . become conductive.

In FIGS. 7 and 8 respectively showing the sectional views taken along lines V—V and VI—VI in FIG. 4, numeral 1 designates a P-type silicon substrate which exhibits a specific resistance of, for example, 10 Ω.cm. Numeral 2 designates a thick Si oxide film, which is formed by selectively subjecting the Si substrate 1 to thermal oxidation by employing an $Si_3N_4$ film or the like as a mask, and the thickness of which is, for example, 1 μm. Numeral 3 designates a thin Si oxide film which is formed by lightly thermally oxidizing the Si substrate 1, and the thickness of which is 700–3,000 Å. Numeral 4 designates a polycrystalline silicon layer, which has a thickness of, for example, 3,500 Å and whose conductivity type is the N-type determined simultaneously with that of an N-type region 5 to be stated below. Structurally, the polycrystalline Si layers 4 are used as the gate electrode, the capacitor electrode and an interconnection layer.

Numeral 5 indicates the region which is doped with an N-type impurity such as phosphorus, and which is used as the source or drain region of the MISFET or an interconnection layer. By way of example, region has a thickness of 1 μm and a specifi of 15 Ω.cm.

Numeral 6 represents a phosphorus glass film ($P_2O_5$ $SiO_2$) which is doped with phosphorus, and which is formed into a thickness of, e.g., 0.9μ by chemical vapor growth at a low temperature. The phosphorus glass film 6 serves is useful as passivation for stabilizing the characteristics of the MISFET's etc. or as an inter-layer insulating film in multi-layer interconnections. Shown at 7 is an aluminum film.

Numeral 8 denotes an end portion of the thick oxide film 2, which corresponds to a bold boundary line in the plan view of FIG. 4. Referring to FIG. 4, the so-called contact holes respectively indicated by marks ○ are provided in the phosphorus glass film 6 in order to electrically connect the polycrystalline Si layer 4 (indicated by a dotted area) and the Al layer 7, in the oxide film 3 in order to connect the polycrystalline Si layer 4 and a diffused layer 5', and in the phosphorus glass film 6 and the oxide film 3 in order to connect the diffused layer 5 and the Al layer 7.

In FIGS. 7 and 8, owing to the polycrystalline Si layer 4 connected to a power source $V_{DD}$, an electric field is applied to the surface of the semiconductor substrate 1 underlying this layer 4. In this case, the electric field is intense at the part of the thin oxide film 3, so that a channel layer, i.e., an inversion layer 9 is induced in the surface of the semiconductor substrate 1 underneath the thin oxide film 3. In contrast, the electric field is weak underneath the thick oxide film 2, so that no inversion layer is induced.

The capacitor, e.g., $C_{26}$ is built up of the polycrystalline Si layer 4, the thin oxide film 3 as a dielectric, and the channel layer 9.

The inversion layer 9 is joined with the N-type region which functions as the source or drain of the MISFET, e.g., $M_{26}$. Accordingly, one of the electrodes of the capacitor $C_{26}$ is connected to the source or drain of the MISFET $M_{26}$, and the charging or discharging operation for the capacitor $C_{26}$ is carried out through the MISFET $M_{26}$. While, as described above, the N-type channel layer 9 is used for electrically isolating the one electrode of the capacitor from the P-type substrate, an N-type diffused layer can also be employed instead of the channel layer 9 of the capacitor $C_{26}$. In this case, the diffused layer needs to be formed before the formation of the polycrystalline Si layer 4.

In the construction described above, although no special restriction is intended, the dimensions of the capacitor in the memory cell are 10 μm×10 μm. The thick oxide film between the capacitors at the central or inner portion of the memory cell mat, for example, between the capacitors $C_{12}$ and $C_{14}$, has a width of 5 μm. The width of the thick oxide film between the capacitor at the end portion, e.g., $C_{12}$ and the THIN region is 5 μm equal to the width at the central portion. Further, the width of the THIN region is 5 μm.

The foregoing structure can be fabricated by the known silicon gate technique. In that case, the P-type silicon substrate 1 having the specific resistance of 10 Ω.cm is prepared, and its surface is covered with a thin $Si_3N_4$ film. Subsequently, the $Si_3N_4$ film is selectively etched and removed so as to be left at those portions of the surface of the silicon substrate 1 at which the source, drain and gate regions of the MISFET's, the capacitor regions and the THIN regions are to be formed. By thermally oxidizing the resultant silicon substrate, the oxide film 2 being 1μ thick is formed on the surface which is not covered with the $Si_3N_4$ film. After etching and removing the $Si_3N_4$ film, the thin oxide film 3 being 700Å–3,000 Å thick is formed on the surface of the silicon substrate 1 by thermal oxidation.

At this time, the pattern of the thick oxide film 2 and the thin oxide film 3 in FIG. 4 becomes as shown in FIG. 5.

Subsequently, a photoresist film is formed on the whole surface. The photoresist film is exposed to light and developed so as to expose the thin film on the THIN regions and interconnection regions 11. Using the photoresist film as a mask, the thin oxide film is selectively etched.

Phosphorus as the N-type impurity is diffused into the exposed surface of the silicon substrate by a known method, to form the THIN regions and the interconnection regions. A thin oxide film formed on the THIN regions at the diffusion is removed by photoetching again.

Subsequently, a polycrystalline silicon layer is deposited over the entire area of the substrate surface by the chemical vapor deposition. At this stage, the THIN regions and the deposited polycrystalline Si layer are connected. However, at areas on the substrate corresponding to the source, gate and drain regions of the MISFET's and the capacitor regions to be formed later, the polycrystalline Si layer is isolated from the substrate by the thin oxide film. Thereafter, the polycrystalline Si layer is selectively photoetched so as to leave portions to be used for the interconnections, gates and capacitors.

Using the remaining polycrystalline Si layer as an etching mask, the oxide film is thinly etched. Thus, only the silicon substrate surface having been formed with the thin oxide film is exposed.

Subsequently, phosphorus is diffused into the substrate surface as the N-type impurity. Since, in this case, the thick oxide film and the thin oxide film which underlies the polycrystalline Si layer acts as diffusion masks on the phosphorus, the diffusion pattern becomes as indicated by solid lines in FIG. 6. In the figure, portions enclosed within broken lines and the solid lines serve as the gate regions of the MISFET's, and portions enclosed with one-dot chain lines and the solid lines serve as the capacitors.

Subsequently, the phosphorus glass film 6 is deposited over the entire area of the surface by chemical vapor deposition. A photoresist film is deposited on the whole surface, and portions for connecting the aluminum electrodes as indicated by the marks ○ in FIG. 4 are exposed to light and developed. Using the photoresist film as a mask, the phosphorus glass film and the thin oxide film are selectively etched with a well-known etchant adapted to etch only the oxide film. Thereafter, the photoresist film is removed.

Aluminum is evaporated on the substrate surface. Subsequently, the aluminum is slectively etched and removed into the Al layer 7.

In FIG. 4, the memory cells are regularly arrayed along the word lines W and the data lines DL. A set of such arrays builds up the memory cell mat MCA as shown in FIG. 1. The information holding time of a memory cell column at an end portion of the memory mat MCA, in other words, that of the capacitors $C_{21}$, $C_{31}$, $C_{41}$ . . . and $C_{12}$, $C_{22}$, $C_{32}$ . . . joined to the word lines $W_1$ and $W_2$ in FIG. 4, is shorter by a ratio of $\frac{1}{2}$-1/10 as compared with those of central or inner columns, i.e., columns on the right of the end column. Provided in order to lengthen the information holding time at the end portion are the hatched THIN regions connected to the power source $V_{DD}$ through the polycrystalline Si layers. As apparent from FIG. 8, the THIN regions are arrayed along, and in close proximity to, the thin thermal oxidation film regions 3 of the memory cell column joined to the word lines $W_1$ and $W_2$.

In the THIN region, the thick thermal oxidation film 2 does not exist, and the substrate surface is not formed with any thermal oxidation film or is formed with only a very thin thermal oxidation film at the diffusion. Owing to the recess of the THIN region, the width of the thick oxide film 2 lying on the left side of the capacitor, e.g., $C_{31}$, becomes small. Therefore, minority carriers which travel towards the capacitor $C_{31}$ from the substrate outside the left end of the capacitor $C_{31}$ flow into the THIN region. As a result, a leakage current flowing to the channel layer 9 of the capacitor $C_{31}$ decreases at substantially the same extent as a value at the central part of the memory cell mat. The effect of the THIN region will also be apparent from the explanation of FIG. 2.

In order to eliminate the limitation upon use of the memory system ascribable to the decrease in the information holding time of the memory cells at the end portion of the memory mat, or in order to moderate the limitation to an extent allowable for practical use, the spacing between the recess of the THIN region and the recess of the thick oxide film 9 in the memory cell ($C_{31}$) should preferably be made equivalent to or smaller than the spacing between the memory cells ($C_{31}$ and $C_{33}$), as in the embodiment.

The above description has centered on the leakage current in the capacitor. However, also in the case where the interconnection layer of the capacitor is constructed of a diffused region or the like, a leakage current in the diffused region sometimes poses a problem. Even in the case where, as seen in the memory cell of the present embodiment, the source or drain region of the MISFET is connected to the capacitor, a leakage current in the source or drain junction sometimes poses a problem. It is considered that, in such cases, the leakage current can be reduced by arranging the recess THIN of the thick oxide film in the vicinity of the corresponding portion in the same manner. For example, in FIG. 4, it is considered that, not only a leakage current in a portion Q of the capacitor $C_{22}$, but also a leakage current in a portion P of the source or drain of the MISFET $M_{22}$ can be reduced by providing the recess THIN.

Although, this invention as described above relates to the embodiment, it is not restricted thereto. A variety of modified means can be adopted on the basis of the foregoing technical idea. Examples will be discussed hereunder.

In FIG. 3, the capacitor $C_d$ for the dummy cell is held in the discharge state by the MISFET $M_{d2}$ which is in the "on" state when the chip is non-selected. The capacitor $C_d$ serves only to bestow a reference potential on the pre-amplifier at the selection of the chip, and it does not conduct any information holding operation at the non-selection of the chip. Therefore, the leakage current scarcely becomes a problem as to the dummy cell.

Figure 9:
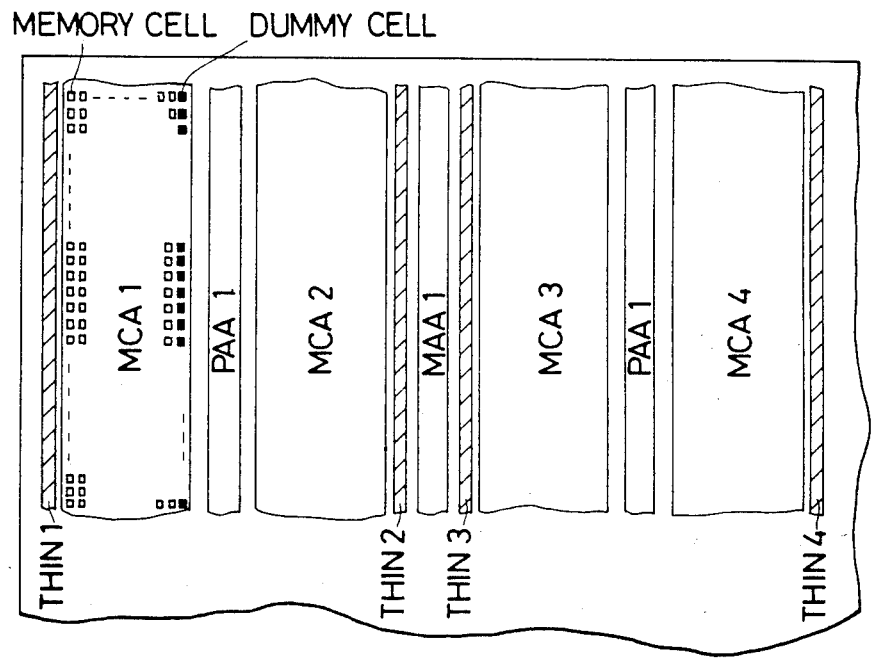
FIG. 9 is a plan view of another embodiment of the dynamic storage device.

FIG. 9 shows an embodiment wherein, in place of the regions THIN 2, THIN 3, THIN 6 and THIN 7 in FIG. 1, dummy cells are arranged in memory cell mats MCA 1 to MCA 4 confronting pre-amplifiers PAA 1 and PAA 2. In this embodiment, the information holding time of the memory cells adjoining the dummy cells becomes sufficiently long owing to the dummy cells.

Figure 10:
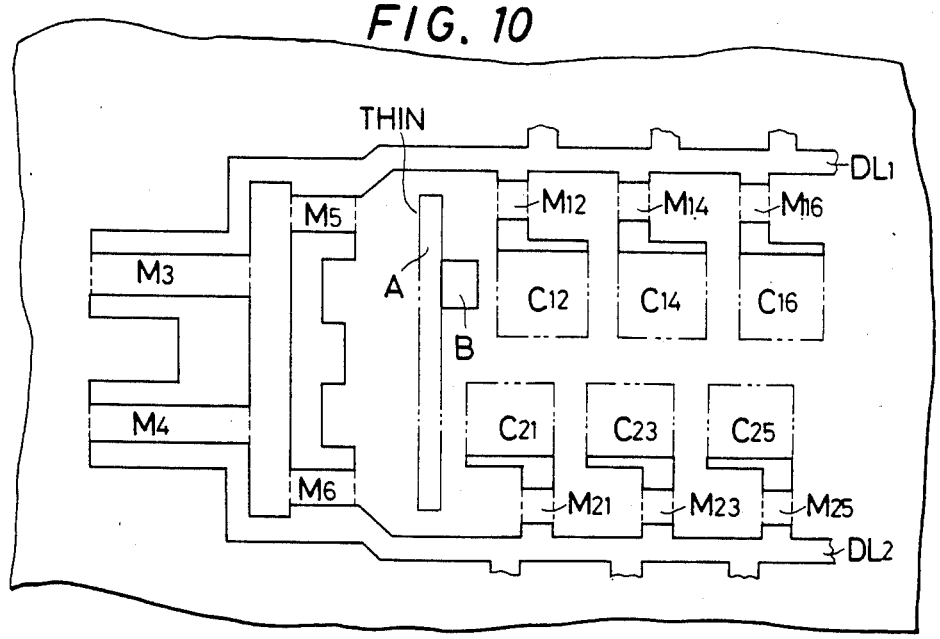
FIG. 10 is a plan view of still another embodiment of the dynamic storage device.

Further, as illustrated in FIG. 10 which shows diffused regions, gate regions and capacitor regions as in FIG. 6, a THIN region to be provided in proximity to the end portion of a memory cell mat can be made up of an N-type region B and an inversion region A joined to the region B by a construction similar to that of capacitors $C_{12}$ to $C_{25}$. In this case, although now shown, a polycrystalline Si layer connected to a power source $V_{DD}$ is connected to the N-type region B, and extends on the region A formed with a thin oxide film.

Figure 11:
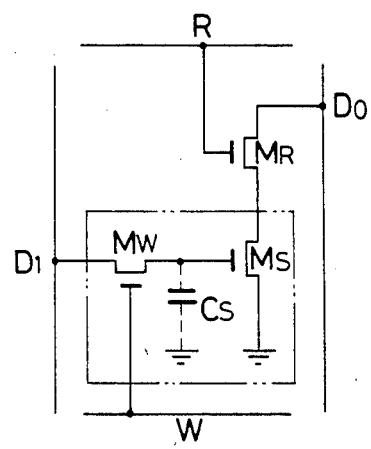
FIG. 11 is a circuit diagram of a 3-element memory cell.
Figure 12:
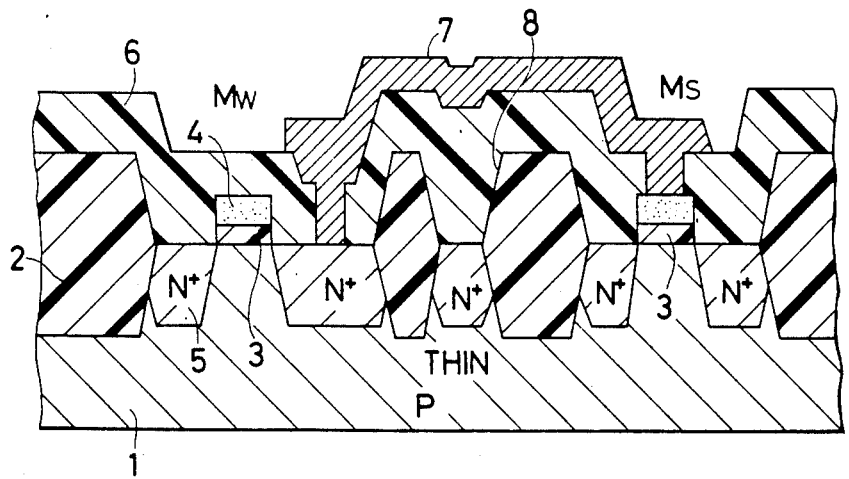
FIG. 12 is a sectional view of another embodiment in which this invention is applied to a dynamic storage device of the 3-element memory cells.

This invention is also applicable to a dynamic storage device such as the 3-element memory device shown in FIG. 11. In this case, a leakage current in the source or drain of a writing MISFET $M_W$ sometimes becomes a problem. This is improved by arranging an N-type region THIN near the source or drain region of the MISFET $M_W$ on the side on which it is connected to a storing MISFET $M_S$ as shown in FIG. 12 ($C_S$ represents stray capacitances such as the gate capacitance of $M_S$ and a wiring capacitance, which are utilized as storage means).

Figure 13:
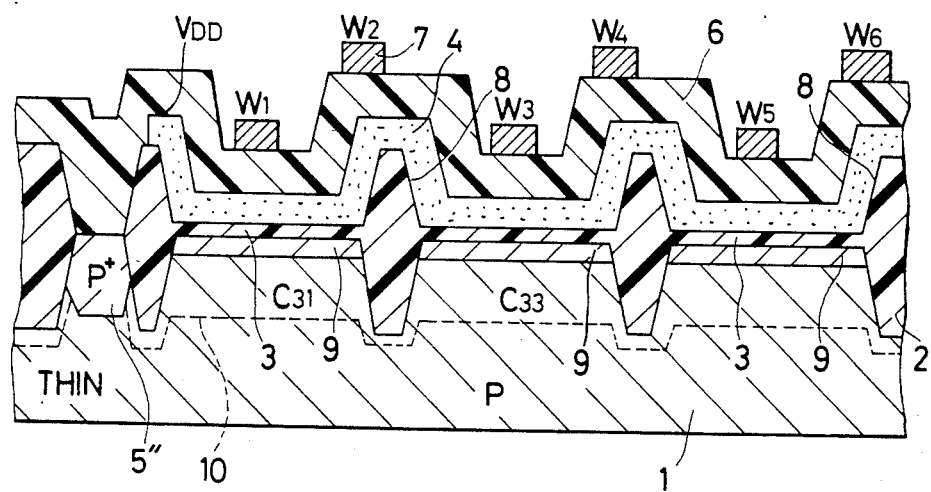
FIG. 13 is a sectional view of a further embodiment.

In this invention, the N-type region 5' connected to the power source $V_{DD}$ in FIG. 8 can be replaced with a P-type region 5" which contains a high concentration of P-type impurity in the substrate 1 as shown in FIG. 13. The P-type region 5" in this case is at the high impurity concentration, and therefore cuts off an inversion region 9 and a depletion layer extending in the interface between oxide films 2 and 3.

I claim:

1. A semiconductor memory circuit device comprising:
   a memory cell array formed at a predetermined area in a main surface of a semiconductor substrate, said memory cell array including a plurality of word lines arranged in parallel with each other in columns, a plurality of data lines arranged in parallel with each other in rows, and a plurality of 1-element type memory cells arrayed in rows and columns, each said memory cell comprising a capacitor which is made up of a semiconductor portion of said main surface of the semiconductor substrate serving as its one electrode and a conductive layer serving as its other electrode and formed on an insulating film formed over said portion of said semiconductor substrate and an insulated gate field-effect transistor electrically connected in series with said capacitor and having its gate electrode connected to one of said word lines, the series connection of said capacitor and insulated gate field-effect transistor being coupled to one of said data lines; and
   at least one semiconductor region having a conductivity type opposite to the conductivity type of said semiconductor substrate, extending substantially along and adjacently to said semiconductor portions of said capacitors of the memory cells arrayed at the most outside row or column of said memory cell array, and formed outside said predetermined area in said main surface of the semiconductor substrate along an edge of said predetermined area which is not opposite transistors in peripheral circuits of said semiconductor memory circuit, but not formed between said adjacent semiconductor portions of the capacitors arrayed at the adjacent rows or columns.

2. A semiconductor memory circuit device according to claim 1, wherein a junction between said semiconductor region and said semiconductor substrate is reverse-biased.

3. A semiconductor memory circuit device according to claim 2, wherein said semiconductor region is an impurity diffused region.

4. A semiconductor memory circuit device according to claim 1, wherein said predetermined area is defined in the form of a rectangle and said semiconductor region is formed along one side portion of said rectangular predetermined area.

5. A semiconductor memory circuit device according to claim 4, wherein said semicondcutor region extends in a direction traversing said data lines.

6. A semiconductor memory circuit device in accordance with claim 1, wherein said semiconductor region comprises a plurality of semiconductor regions extending substantially along and adjacently to said semiconductor portions of said capacitors of the memory cells arrayed at the most outside row or column of said memory cell array.

7. A semiconductor memory circuit device in accordance with claim 1, wherein said predetermined area has an irregularly-shaped boundary, and wherein said semiconductor region extending substantially along and adjacently to said semiconductor portions of said capacitors of the memory cells arrayed at the most outside row or column of said memory cell array conforms to said irregularly-shaped boundary.

8. A semiconductor memory circuit device in accordance with claim 1, wherein said semiconductor portion of said main surface of the semiconductor substrate is an impurity-doped region having a conductivity type opposite to the conductivity type of said semiconductor substrate.

9. A semiconductor memory circuit device in accordance with claim 1, wherein said semiconductor portion of said main surface of the semiconductor substrate is an inversion region.

10. A semiconductor memory circuit device comprising:
    a memory cell array formed at a predetermined area in a main surface of a semiconductor substrate, said memory cell array including a plurality of word lines arranged in parallel with each other in columns, a plurality of data lines arranged in parallel with each other in rows, and a plurality of 1- element type memory cells arrayed in rows and columns, each said memory cell comprising a capacitor which is made up of a semiconductor portion of said main surface of the semiconductor substrate serving as its one electrode and a conductive layer serving as its other electrode and formed on an insulating film formed over said portion of said semiconductor substrate and an insulated gate field-effect transistor electrically connected in series with said capacitor and having its gate electrode connected to one of said word lines, the series connection of said capacitor and insulated gate field-effect transistor being coupled to one of said data lines; and
    at least one inversion region extending substantially along and adjacently to said semiconductor portions of said capacitors of the memory cells arrayed at the most outside row or column of said memory cell array, and formed outside said predetermined area in said main surface of the semiconductor substrate, but not formed between said adjacent semiconductor portions of the capacitors arrayed at the adjacent rows or columns, wherein said inversion region is effected by a structure in which a conductive layer is formed on another insulating film formed over another semiconductor portion of said main surface where said inversion region is to be formed.

11. A semiconductor memory circuit device according to claim 10, wherein said another insulating film is made of silicon oxide, and said conductive layer is made of polycrystalline silicon.

12. A semiconductor memory circuit device according to claim 11, wherein the junction between said inversion region and said semiconductor substrate is reverse-biased.

13. A semiconductor memory circuit device according to claim 12, wherein said predetermined area is defined in the form of a rectangle and said inversion region is formed along one side portion of said rectangular predetermined area.

14. A semiconductor memory circuit device comprising:
a memory cell array formed at a predetermined area in a main surface of a semiconductor substrate, said memory cell array including a plurality of word lines arranged in parallel with each other in columns, a plurality of data lines arranged in parallel with each other in rows, and a plurality of 1-element type memory cells arrayed in rows and columns, each said memory cell comprising a capacitor which is made up of a semiconductor portion of said main surface of the semiconductor substrate serving as its one electrode and a conductive layer sreving as its other electrode and formed on an insulating film formed over said portion of said semiconductor substrate and an insulated gate field-effect transistor electrically connected in series with said capacitor and having its gate electrode connected to one of said word lines, the series connection of said capacitor and insulated gate field-effect transistor being coupled to one of said data lines; and
at least one semiconductor region having a conductivity type opposite to the conductivity type of said semiconductor substrate, extending substantially along and adjacently to said semiconductor portions of said capacitors of the memory cells arrayed at the most outside row or column of said memory cell array and formed outside said predetermined area in said main surface of the semiconductor substrate, but not formed between said adjacent semiconductor portions of the capacitors arrayed at the adjacent rows or columns, wherein said predetermined area has an irregularly-shaped boundary, and wherein said semiconductor region extending substantially along and adjacently to said semiconductor portions of said capacitors of the memory cells arrayed at the most outside row or column of said memory cell array conforms to said irregularly-shaped boundary.

15. A semiconductor memory circuit device in accordance with claim 14, wherein said semiconductor region comprises a plurality of semiconductor regions extending substantially along and adjacently to said semiconductor portions of said capacitors of the memory cells arrayed at the most outside row or column of said memory cell array.

16. A semiconductor memory circuit device in accordance with claim 14, wherein said semiconductor portion of said main surface of the semiconductor substrate is an impurity-doped region having a conductivity type opposite to the conductivity type of said semiconductor substrate.

17. A semiconductor memory circuit device in accordance with claim 14, wherein said semiconductor portion of said main surface of the semiconductor substrate is an inversion region.

* * * * *